United States Patent
Nakano et al.

(10) Patent No.: US 7,382,680 B2
(45) Date of Patent: Jun. 3, 2008

(54) SEMICONDUCTOR INTEGRATED CIRCUIT DEVICE INCLUDING STORAGE UNIT HAVING NONVOLATILE AND VOLATILE MEMORY ELEMENT SECTIONS

(75) Inventors: Hiroaki Nakano, Yokohama (JP); Toshimasa Namekawa, Tokyo (JP); Osamu Wada, Yokohama (JP); Hiroshi Ito, Yokohama (JP); Atsushi Nakayama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/531,118

(22) Filed: Sep. 12, 2006

(65) Prior Publication Data

US 2007/0070693 A1   Mar. 29, 2007

(30) Foreign Application Priority Data

Sep. 13, 2005   (JP)   ............................. 2005-265616
Jan. 24, 2006   (JP)   ............................. 2006-015208

(51) Int. Cl.
   *G11C 11/00*   (2006.01)
(52) U.S. Cl. ..................................... 365/233; 365/200
(58) Field of Classification Search ................ 365/233, 365/200
   See application file for complete search history.

(56) References Cited

U.S. PATENT DOCUMENTS

| | | | | |
|---|---|---|---|---|
| 5,182,719 A | * | 1/1993 | Kuroda et al. ................. | 716/3 |
| 6,102,963 A | | 8/2000 | Agrawal | |
| 7,116,603 B2 | * | 10/2006 | Kanda et al. ............. | 365/225.7 |
| 7,274,615 B2 | * | 9/2007 | Nakagawa et al. ...... | 365/225.7 |
| 2004/0120204 A1 | * | 6/2004 | Kanda et al. ............. | 365/225.7 |
| 2005/0212847 A1 | * | 9/2005 | Tsuji ........................... | 347/19 |
| 2006/0133127 A1 | | 6/2006 | Nakano et al. | |
| 2006/0219796 A1 | * | 10/2006 | Na .............................. | 235/492 |
| 2006/0227643 A1 | * | 10/2006 | Nakagawa et al. ...... | 365/225.7 |
| 2007/0070693 A1 | | 3/2007 | Nakano et al. | |

OTHER PUBLICATIONS

Hiroshi Ito, et al., "Pure CMOS One-Time Programmable Memory Using Gate-Ox Anti-Fuse", Proceedings of the IEEE 2004 Custom Integrated Circuits Conference, pp. 469-472.
U.S. Appl. No. 11/839,199, filed Aug. 15, 2007, Matsufuji et al.

* cited by examiner

*Primary Examiner*—Michael T Tran
(74) *Attorney, Agent, or Firm*—Oblon, Spivak, McClelland, Maier & Neustadt, P.C.

(57) ABSTRACT

A semiconductor integrated circuit device includes a storage unit arranged on a semiconductor chip to store a plurality of data, and a plurality of registers provided on the semiconductor chip, the registers storing the data transferred from the storage unit, respectively. The storage unit has a nonvolatile memory element section and a volatile memory element section. The nonvolatile memory element section includes an address area which stores identification information of the registers as addresses and a data area which stores the data to correspond to the addresses by varying electrical characteristics irreversibly. The volatile memory element section temporarily stores the data read from the nonvolatile memory element section.

17 Claims, 8 Drawing Sheets

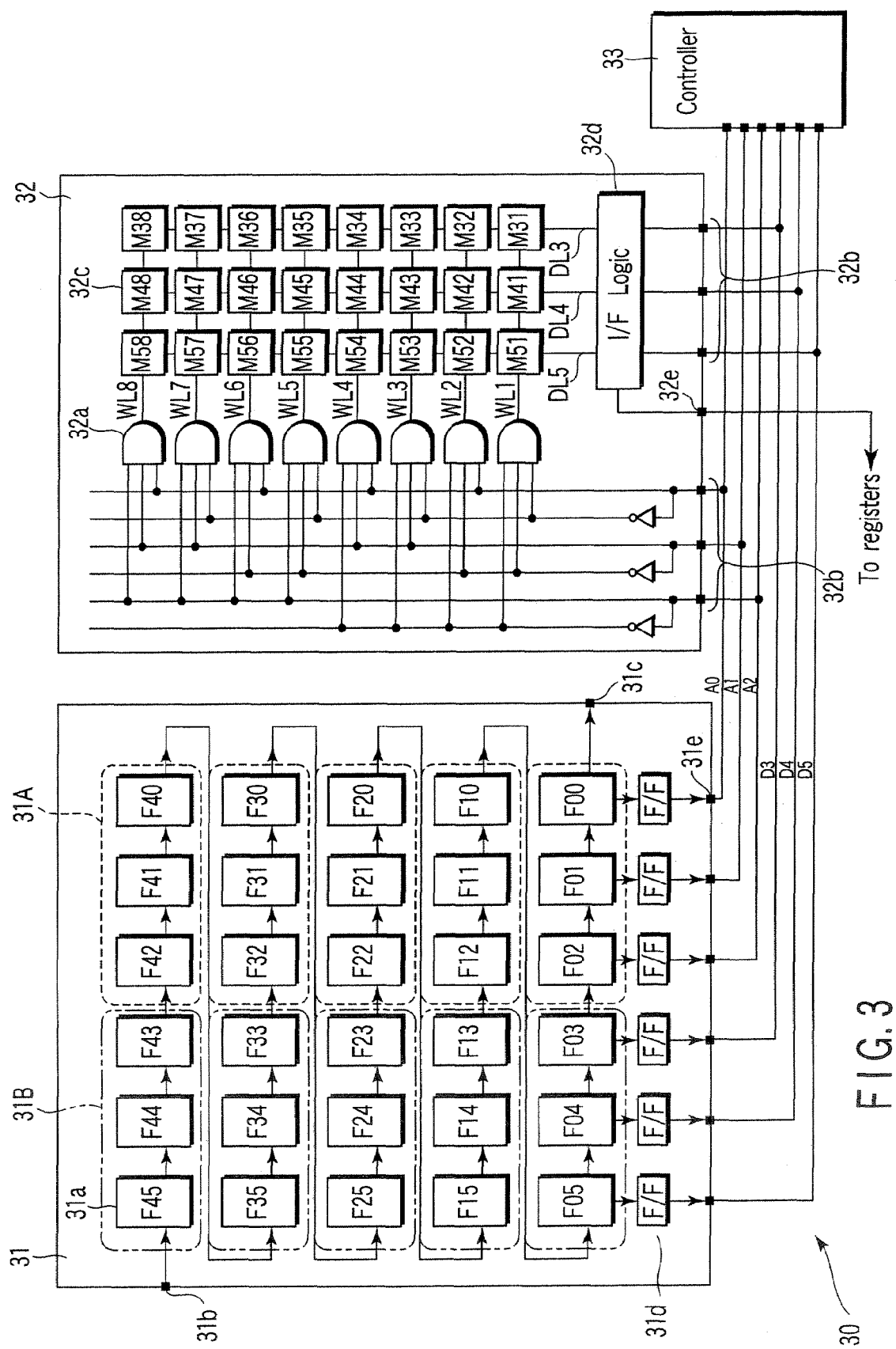
F I G. 3

| Circuit | Register | Identification information | Address area | Data area |
|---|---|---|---|---|
| CHIP-ID | 21 | 1 | F00,F01,F02 | F03,F04,F05 |
| Circuit 13 | 22 | 2 | F10,F11,F12 | F13,F14,F15 |
| Circuit 14 | 23 | 3 | F20,F21,F22 | F23,F24,F25 |
| SRAM12 | 24 | 4 | F30,F31,F32 | F33,F34,F35 |

FIG. 5

| Circuit | Register | Identification information | Address area | Data area |
|---|---|---|---|---|
| CHIP-ID | 21 | 1 | F00,F01,F02 | F03,F04,F05 |
| Circuit 13 | 22 | 2 | F10,F11,F12 | F13,F14,F15 |
| Circuit 14 | 23 | 3 | F20,F21,F22 | F23,F24,F25 |
| SRAM12 | 24 | 4 | F30,F31,F32 | F33,F34,F35 |
| Circuit 13 | 22 | 2 | F40,F41,F42 | F43,F44,F45 |

FIG. 6

SEMICONDUCTOR INTEGRATED CIRCUIT DEVICE INCLUDING STORAGE UNIT HAVING NONVOLATILE AND VOLATILE MEMORY ELEMENT SECTIONS

CROSS-REFERENCE TO RELATED APPLICATIONS

This application is based upon and claims the benefit of priority from prior Japanese Patent Applications No. 2005-265616, filed Sep. 13, 2005; and No. 2006-015208, filed Jan. 24, 2006, the entire contents of both of which are incorporated herein by reference.

BACKGROUND OF THE INVENTION

1. Field of the Invention

The present invention relates to a semiconductor integrated circuit device. More specifically, the invention relates to a system large-scale integrated circuit (LSI) including a storage unit that stores information such as replacement information of memory circuits integrated on a chip, chip identification codes and setting information for setting circuit constants of, e.g., power supply circuits, and the like.

2. Description of the Related Art

With the recent advance of integrated circuit technology, a semiconductor integrated circuit device called a system LSI including various types of circuits having different functions and integrated on one or more chips has been achieved. As circuits integrated on the system LSI, there are a logic circuit for performing various operations, a memory circuit for storing information such as results of the operations, a power supply circuit such as an internal potential generation circuit for generating an internal potential, different types of analog circuits, and the like.

Some of the above circuits need their internal settings to be changed after the system LSI is manufactured and tested or after it is sealed in a package. As settings to be changed, there can be considered replacement information for replacing a defective cell with a defect-free cell in the memory circuit and setting information for setting circuit characteristics (circuit constant) of the circuit in the internal potential generation circuit. Conventionally, such information is stored in a nonvolatile memory on a chip or outside a chip. For simplification of management of a system LSI sealed in a package, each chip has coded identification information (chip identification code) and, in such a case, too, the nonvolatile memory is used.

In the system LSI so configured, information items are read in sequence from the nonvolatile memory at power-on. The read information items are transferred to a register for storing chip identification codes, a register for storing setting information of the internal potential generation circuit, and a register for storing replacement information of the memory circuit. Thus, the internal settings of the respective circuits are performed in accordance with the information items stored in the registers.

As the above nonvolatile memory, a fuse macro including a plurality of fuse elements has, conventionally, often been used. Well-known examples of the above-described fuse elements include fuses for fusing a wiring layer by a laser beam, fuses for fusing a wiring layer by current (current-fusing type), and fuses for breaking a gate oxide film of a transistor by a high voltage (high-voltage breaking type). These can be added with the manufacturing process of a system LSI being hardly changed, and the occupied areas are small and the control thereof is easy, which leads to a broad range of use thereof. Further, because such fuse elements can be programmed only once from the property thereof, they are called one-time programmable (OTP) memories. Note that, with respect to some of the fuse elements which are electrically programmed, such as a current-fusing type and a high-voltage breaking type, there is the advantage that programming can be carried out even after the system LSI is sealed in a package, which has been attracting attention in particular.

However, there is a problem in that no information can be overwritten (rewritten) to a blown fuse element. If a fuse element is blown only once, the fuse macro can serve as a nonvolatile storage unit sufficiently. However, various types of tests are conducted on a system LSI and there is a case where the written information has to be rewritten after another test. The fuse macro cannot cope with this case.

As the prior art of the present invention, for example, U.S. Pat. No. 6,102,963 proposes transferring data serially from a data-rewritable nonvolatile memory to a volatile programmable logic device (PLD).

BRIEF SUMMARY OF THE INVENTION

According to a first aspect of the present invention, there is provided a semiconductor integrated circuit device comprising: a storage unit arranged on a semiconductor chip to store a plurality of data; and a plurality of registers provided on the semiconductor chip, the registers storing the data transferred from the storage unit, respectively, wherein the storage unit has a nonvolatile memory element section and a volatile memory element section, the nonvolatile memory element section including an address area which stores identification information of the registers as addresses and a data area which stores the data to correspond to the addresses by varying electrical characteristics irreversibly, the volatile memory element section temporarily storing the data read from the nonvolatile memory element section.

According to a second aspect of the present invention, there is provided a semiconductor integrated circuit device comprising: a plurality of circuit components arranged on a semiconductor chip; a storage unit which is arranged on the semiconductor chip to store control data to control the circuit components and which is programmed with the control data by varying electrical characteristics irreversibly, the storage unit including a nonvolatile memory element section and a volatile memory element section, the nonvolatile memory element section having an address area which stores identification information of the circuit components as an address and a data area which stores the control data to correspond to the address, the volatile memory element section temporarily storing control data read from the nonvolatile memory element section; and a plurality of registers provided on the semiconductor chip to correspond to the circuit components, respectively, the registers storing control data transferred from the storage unit.

BRIEF DESCRIPTION OF THE SEVERAL VIEWS OF THE DRAWING

FIG. 3 is a diagram showing an example of a storage unit in the system LSI shown in FIG. 1;

FIG. 5 is a table illustrating an operation of the storage unit shown in FIG. 3;

FIG. 6 is another table illustrating an operation of the storage unit shown in FIG. 3;

DETAILED DESCRIPTION OF THE INVENTION

An embodiment of the present invention will be described with reference to the accompanying drawings. It should be noted that the drawings are schematic ones and the dimension ratios shown therein are different from the actual ones. The dimensions vary from drawing to drawing and so do the ratios of dimensions.

First Embodiment

Figure 1:
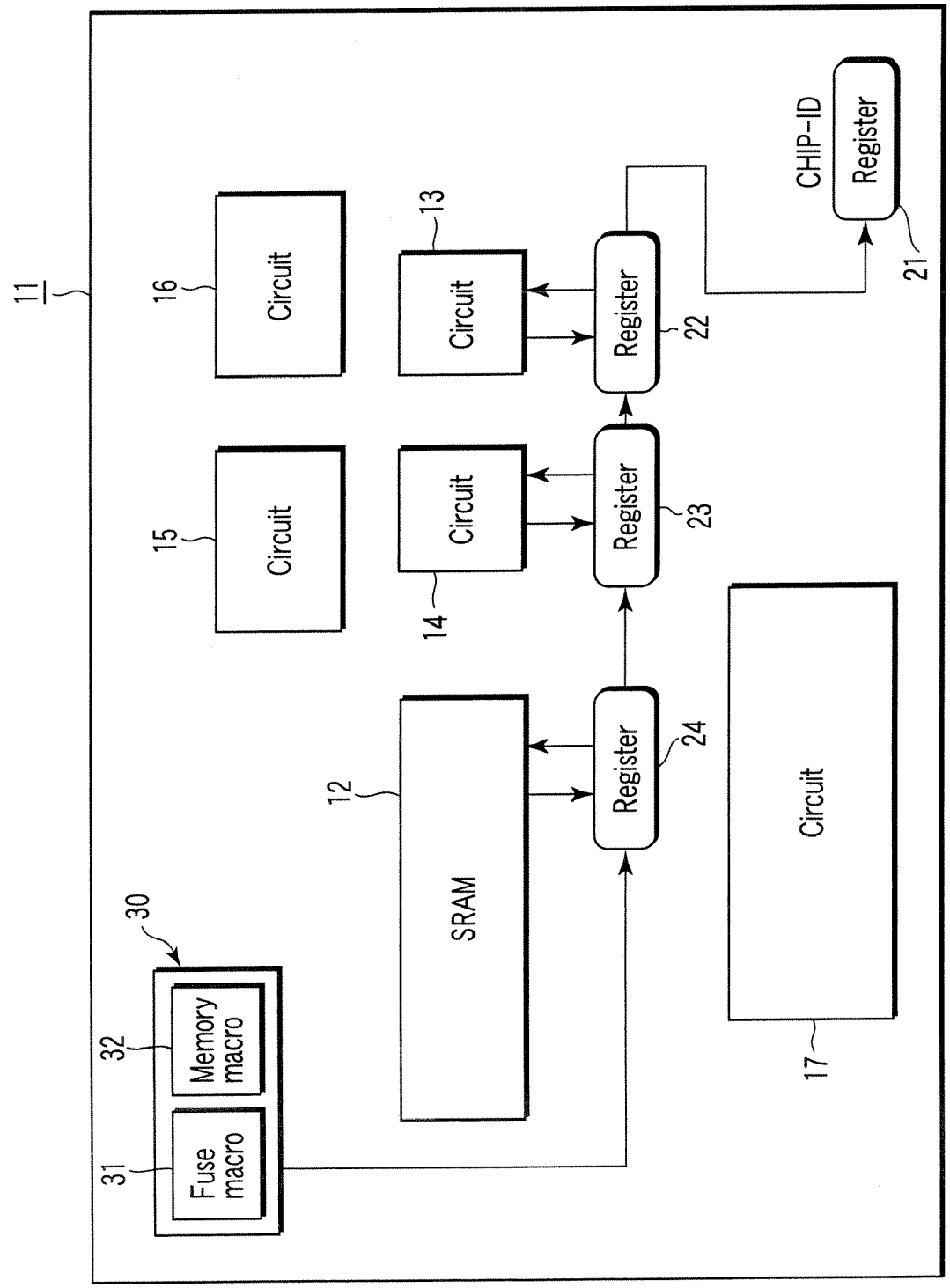
FIG. 1 is a block diagram showing a configuration of a system LSI according to a first embodiment of the present invention.

FIG. 1 shows a basic configuration of a system LSI (semiconductor integrated circuit device) according to a first embodiment of the present invention. In this embodiment, the system LSI is configured by integrating various circuits having different functions on a single chip.

Referring to FIG. 1, a plurality of circuits (circuit components) 12 to 17 are integrated on a semiconductor chip 11. The circuit 12 is a memory circuit (e.g., static random access memory [SRAM]) for storing information such as results of operations. The circuits 13 to 17 are logic circuits for performing various operations, power supply circuits such as internal potential generation circuits for generating an internal potential, different types of analog circuits, or the like.

For example, four registers 21 to 24 are mounted on the semiconductor chip 11. Register 21 is provided to simplify the management of the system LSI that is sealed in a package and store a chip identification code (CHIP-ID). Register 22 stores data for controlling circuit 13 (the data is, for example, setting information for setting the characteristics (circuit constant) of the internal potential generation circuit 13 if circuit 13 is an internal potential generation circuit). Register 23 stores data for controlling circuit 14 (the data is setting information for setting the circuit constant of circuit 14). Register 24 stores replacement information for replacing a defective cell of the SRAM with a defect-free cell as data for controlling circuit 12. Registers 21 to 24 are connected serially to each other.

A storage unit 30 for storing plural items of data transferred to registers 21 to 24 (a chip identification code and control data for circuit 12 to 14) is mounted on the semiconductor chip 11. The storage unit 30 includes a nonvolatile fuse macro (nonvolatile memory element section) 31 and a volatile memory macro (volatile memory element section) 32. The storage unit 30 transfers the chip identification code and the control data serially to each of registers 21 to 24.

Figure 2:
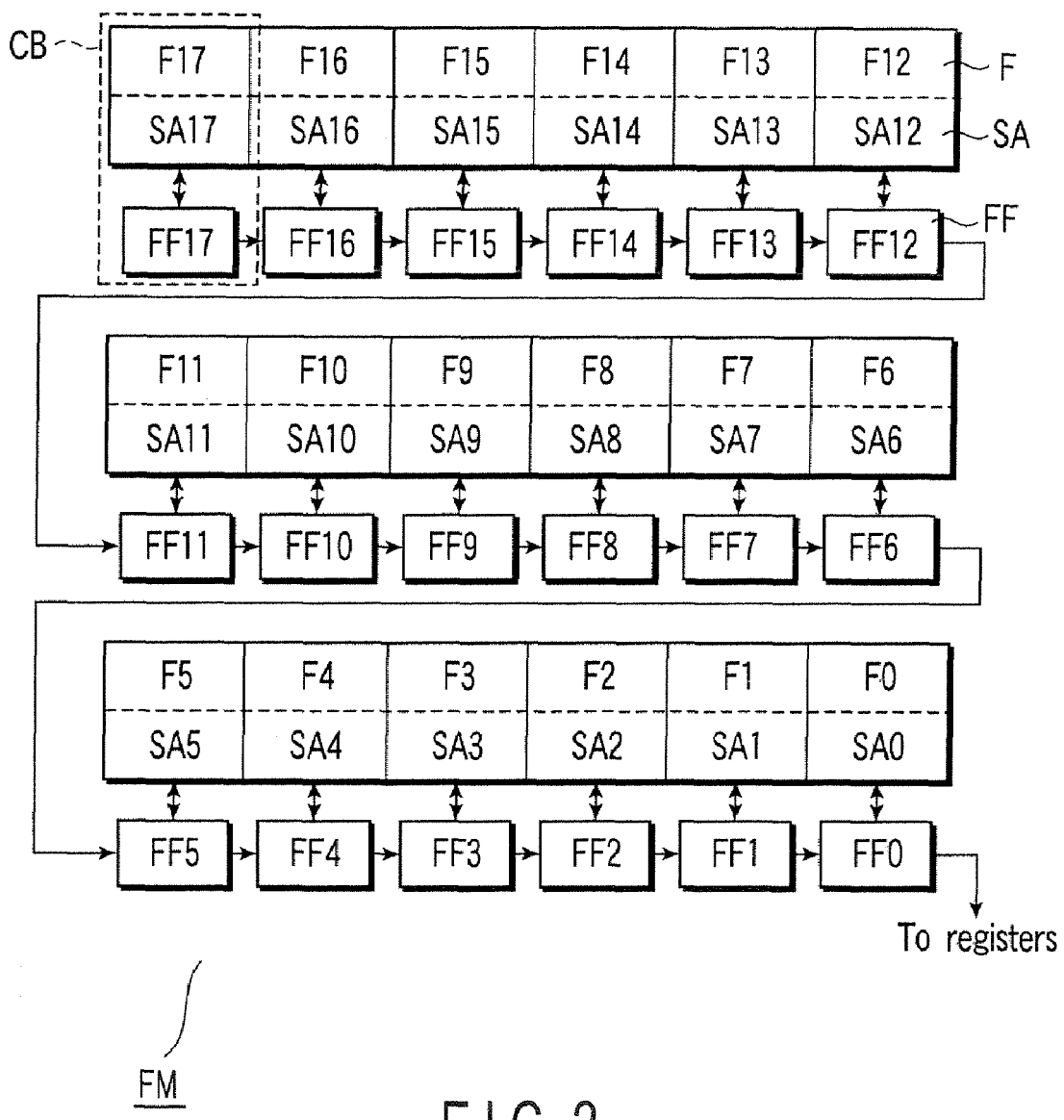
FIG. 2 is a diagram showing an example of a fuse macro used as a storage unit in a system LSI.

A storage unit for storing a chip identification code and control data will now be described. FIG. 2 shows a configuration of a fuse macro used as a storage unit in a system LSI in comparison with the configuration shown in FIG. 1.

In the fuse macro FM shown in FIG. 2, a unit block CB of a fuse includes a fuse cell F for holding data, a sense amplifier SA composed of a sense circuit for reading data out of the fuse cell F, a data register FF for reading/writing data from/to the fuse cell F. The data register FF of the unit block CB is connected serially to that of a unit block CB adjacent thereto. The fuse macro FM is configured by, e.g., eighteen unit blocks CB.

If the above fuse macro FM is applied to the system LSI shown in FIG. 1, data is generally assigned to the fuse cell F. For example, the chip identification codes CHIP-ID are assigned to fuse cells F0 to F3. The control data for controlling circuits 13 and 14 is assigned to fuse cells F4 to F9. The control data for controlling circuit 12 is assigned to fuse cells F10 to F17.

FIG. 3 shows a configuration of the storage unit 30 applied to the system LSI shown in FIG. 1. In the present embodiment, the fuse macro 31 is a one-time programmable (OTP) memory to which a chip identification code and control data can be written only once. The fuse macro 31 includes high voltage breaking type electrical-fuse elements each having two terminals (referred to as e-fuse elements hereinafter) as irreversible storage elements (fuse cells). The e-fuse elements store fuse data by applying a high voltage, which exceeds the largest rating, to a metal oxide semiconductor (MOS) semiconductor device and breaking the gate insulation film of the semiconductor device physically. In this case, fuse data "0" is stored in the e-fuse elements before the insulation film is broken, and fuse data "1" is stored therein after it is broken.

As the fuse cell sections, for example a storage element that stores fuse data by causing current to flow through the wiring layer to electrically insulate it can be used, as can be a storage element that stores fuse data by irradiating the wiring layer with a laser beam to physically break the wiring layer.

Referring to FIG. 3, in the fuse macro 31, plural (in this embodiment, thirty) fuse cell sections (F00 to F05, F10 to F15, F20 to F25, F30 to F35, F40 to F45) 31a which are represented as "Fij" are arranged. These fuse cell sections 31a are connected serially to each other as shown in FIG. 3 to transfer fuse data in sequence. The fuse cell section 31a of the most significant bit (F45) is connected to a serial-in terminal 31b of an external input terminal to receive the fuse data transferred serially. The fuse cell section 31a of the least significant bit (F00) is connected to a serial-out terminal 31c of an external output terminal to output the fuse data transferred serially. A latch circuit (F/F) 31d is connected to the fuse cell sections (F00, F01, F02, F03, F04, F05) 31a of the lowermost layer. A parallel-out terminal 31e is connected to the latch circuit 31d to output 6-bit fuse data at once.

Figure 4:
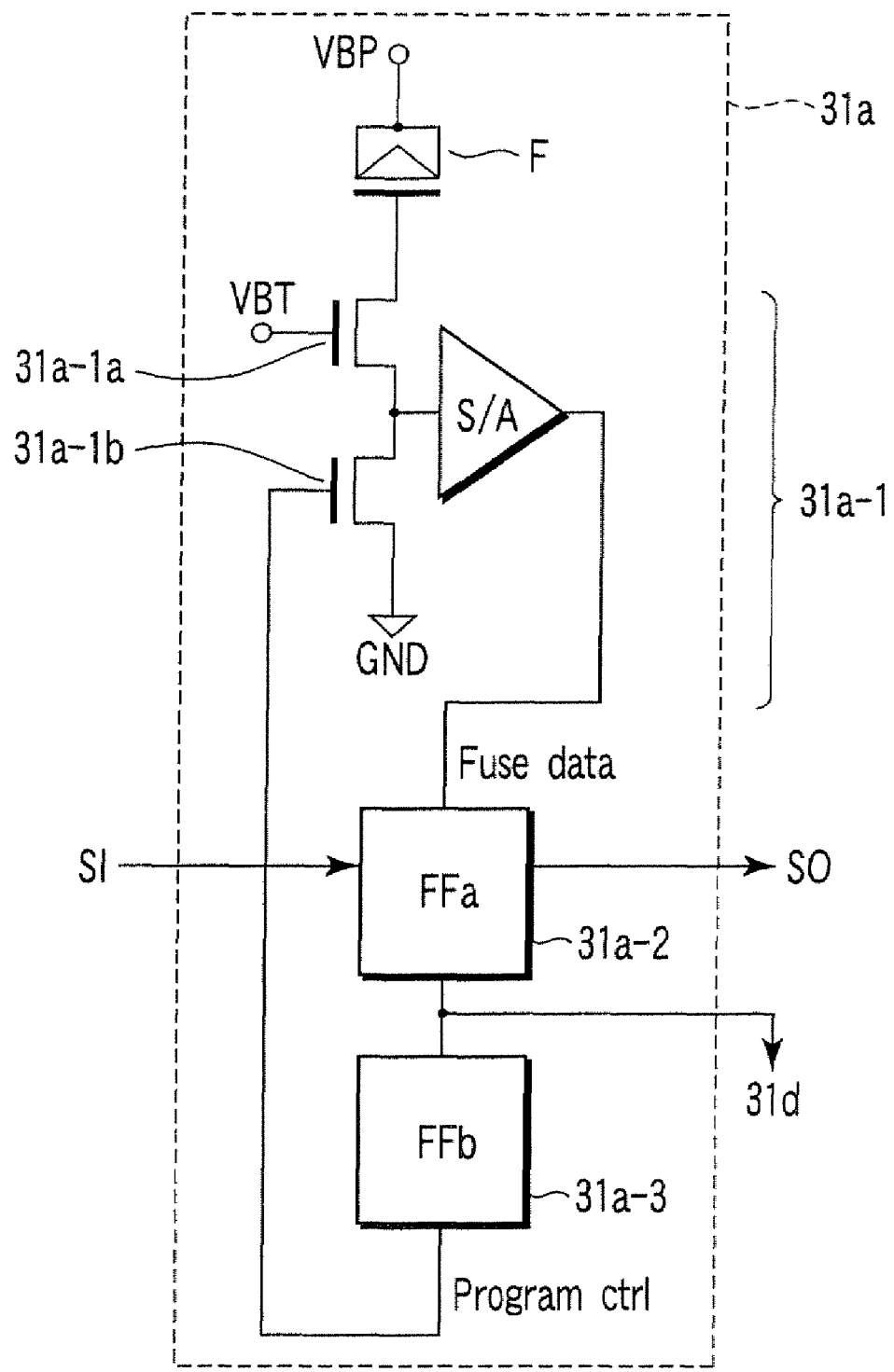
FIG. 4 is a circuit diagram showing a configuration of a fuse cell section in the fuse macro of the storage unit shown in FIG. 3.

FIG. 4 shows a configuration of the fuse cell sections 31a in more detail. Each fuse cell section 31a corresponds to the above-described unit block CB, and is configured to have a fuse cell F (for example, an e-fuse element having two terminals) for holding data, a data sensing/programming circuit 31a-1, a data control circuit (data register FFa) 31a-2 and a data holding circuit (data register FFb) 31a-3. The data sensing/programming circuit 31a-1 configures a sense control circuit section for reading data of the fuse cell F. The data control circuit 31a-2 configures a data buffer/register section, which is for controlling hold/transfer of fuse data. The data holding circuit 31a-3 controls a program for the fuse elements.

A potential VBP (a high voltage over the maximum rating of the e-fuse elements) from a voltage control block (not shown) is applied to the substrate side (substrate and source/ drain) of the fuse cell F at the time of writing data. The other terminal (gate) of the fuse cell F is connected to one of the source/drain terminals of an n-type MOS transistor 31a-1a of the data sensing/programming circuit 31a-1.

The data sensing/programming circuit 31a-1 has a sense amplifier S/A that senses data (for example, a voltage value) read from the fuse cell F on the basis of a magnitude relation with a reference value. Further, the data sensing/programming circuit 31a-1 has a voltage relaxation transistor 31a-1a for preventing a voltage over the rated value from being directly applied to the sense amplifier S/A and the like via the fuse cell F. Moreover, the data sensing/programming circuit 31a-1 has n-type MOS transistors 31a-1b for discharging the sense amplifier S/A, and for programming data. Namely, one of the source/drain terminals of the n-type MOS transistor 31a-1b is connected to the other of the source/drain terminals of the n-type MOS transistor 31a-1a, and an input terminal of the sense amplifier S/A is connected to the connection point. A potential VBT (midpoint potential) from the voltage control block is always applied to the gate electrode of the n-type MOS transistor 31a-1a. The other of the source/drain terminals of the n-type MOS transistor 31a-1b is connected to a ground potential GND, and a program control signal Program ctrl which will be described later is to be supplied to the gate electrode. In other words, the n-type MOS transistors 31a-1a and 31a-1b are connected in series, which makes it possible to discharge the sense amplifier S/A and program data in accordance with an active status of the program control signal Program ctrl.

An output terminal of the sense amplifier S/A in a corresponding fuse cell section 31a and a data control circuit 31a-2 of a fuse cell section 31a adjacent thereto are connected to the data control circuit 31a-2 (SI/SO). The data control circuit 31a-2 is designed to transfer fuse data from the sense amplifier S/A or fuse data from the data control circuit 31a-2 of a fuse cell section 31a at the previous stage to the data control circuit 31a-2 of a fuse cell section 31a at the subsequent stage. Further, the data control circuit 31a-2 is configured to supply the program control signal Program ctrl to the gate electrode of the n-type MOS transistor 31a-1b via the data holding circuit 31a-3.

In the configuration described above, the program control signal Program ctrl from the data holding circuit 31a-3 is activated at the time of writing data. Then, both the n-type MOS transistors 31a-1a and 31a-1b are made to be in a conductive state, and a potential at a node at the gate side of the fuse cell F is lowered to a potential VSS. At that time, because a potential VBP is applied to the substrate side of the fuse cell F, a voltage VBP over the maximum rating is applied to the gate insulating film of the fuse cell F, which breaks the gate insulating film. In this way, programming of fuse data (for example, writing of data "1") is carried out.

First of all, the program control signal Program ctrl is activated at the time of reading data as well. Then, the n-type MOS transistor 31a-1b is made to be in a conductive state, and the node which is sensed by the sense amplifier S/A is discharged to be at a potential VSS. Thereafter, the N-type MOS transistor 31a-1b is turned off, and a predetermined potential less than or equal to the potential VBP is applied to the fuse cell F. At this time, if the fuse cell F has been programmed (in a state of holding data "1"), the node connected to the sense amplifier S/A is charged via the fuse cell F and the transistor 31a-1a, and accordingly, a potential rises. On the other hand, when the fuse cell F has not been programmed (in a state of holding data "0"), it is impossible to cause current to flow through the fuse cell F. For this reason, the node connected to the sense amplifier S/A maintains the potential VSS. In this way, reading of fuse data is carried out by comparing a potential to be generated with a reference potential.

Note that, in the case of the present embodiment, a write control circuit serving as a data line control circuit is achieved by the data holding circuit 31a-3 and the n-type MOS transistor 31a-1b.

Further, although not shown in the present embodiment for convenience, there are provided, for example, an internal potential generation circuit and a logic circuit section (not shown) in the fuse macro 31. The internal potential generation circuit and logic circuit section load various control signals or the like from the side of an external controller to thereby prepare new control signals or generate an internal potential for use in control of the sense amplifier S/A or the like.

In the configuration of FIG. 3, the respective fuse cell sections 31a in the fuse macro 31 are assigned to two areas 31A and 31B. For example, the fuse cell sections 31a of the area (address area) 31A store identification information (storage address) for identifying the circuits 12, 13 and 14 that require control data and a chip identification code CHIP-ID. Of the fuse cell sections 31a represented as "Fij", the cell sections 31a whose j is equal to 0, 1 and 2 are included in the area 31A. In contrast, the fuse cell sections 31a of the area (data area) 31B store control data for optimizing the circuits 12, 13 and 14 as well as the chip identification code CHIP-ID. Of the fuse cell sections 31a represented as "Fij", the cell sections 31a whose j is equal to 3, 4 and 5 are included in the area 31B.

More specifically, as shown in FIG. 5, when the chip identification code CHIP-ID is stored in the register 21, identification information "1" is written to the fuse cell sections 31a of F00, F01 and F02 corresponding to the address area 31A. The chip identification code CHIP-ID is also written to the fuse cell sections 31a of F03, F04 and F05 corresponding to the data area 31B. Similarly, when setting information of the circuit 13 is stored in the register 22, identification information "2" is written to the fuse cell sections 31a of F10, F11 and F12 corresponding to the address area 31A. The setting information is also written to the fuse cell sections 31a of F13, F14 and F15 corresponding to the data area 31B. Similarly, when setting information of the circuit 14 is stored in the register 23, identification information "3" is written to the fuse cell sections 31a of F20, F21 and F22 corresponding to the address area 31A. The setting information is also written to the fuse cell sections 31a of F23, F24 and F25 corresponding to the data area 31B. Similarly, when replacement information of the memory circuit (SRAM) 12 is stored in the register 24, identification information "4" is written to the fuse cell sections 31a of F30, F31 and F32 corresponding to the address area 31A. The replacement information is also written to the fuse cell sections 31a of F33, F34 and F35 corresponding to the data area 31B.

As shown in FIG. 3, a memory macro 32 is configured by, e.g., an SRAM. Specifically, the memory macro 32 includes eight decoder circuits 32a for decoding identification information held in the address area 31A. The identification information stored in the address area 31a is output from the parallel-out terminal 31e, transferred through address signal lines A0, A1 and A2, and input to the decoder circuits 32a via data input terminals 32b. Each of the decoder circuits 32a selectively drives one of word lines WL1 to WL8 in accordance with the input identification information.

The memory macro 32 includes twenty-four memory cells 32c represented as "Mij". For example, three memory cells 32c of M31, M41 and M51 are connected to word line WL1. Three memory cells 32c of M32, M42 and M52 are connected to word line WL2. Three memory cells 32c of M33, M43 and M53 are connected to word line WL3. Three memory cells 32c of M34, M44 and M54 are connected to word line WL4. Three memory cells 32c of M35, M45 and M55 are connected to word line WL5. Three memory cells 32c of M36, M46 and M56 are connected to word line WL6. Three memory cells 32c of M37, M47 and M57 are connected to word line WL7. Three memory cells 32c of M38, M48 and M58 are connected to word line WL8.

The memory cells 32c are divided into three groups (of the memory cells 32c represented as "Mij", three cell columns of memory cells 32c whose i is equal to 3, 4 and 5). The memory cells 32c of each of the groups are connected to each other via data lines DL3, DL4 and DL5. Of the memory cells 32c represented as "Mij", the memory cells (M31 to M38) 32c whose i is equal to 3 are connected to the data line DL3, the memory cells (M41 to M48) 32c whose i is equal to 4 are connected to the data line DL4, and the memory cells (M51 to M58) 32c whose i is equal to 5 are connected to the data line DL5.

The memory macro 32 includes an interface logic circuit 32d. A data output terminal 32e, which is connected to the registers 21, 22, 23 and 24, is connected to the interface logic circuit 32d. The chip identification code CHIP-ID and control data stored in the data area 31B and output from the parallel-out terminal 31e, are transmitted through the data lines D3, D4 and D5 and then input to the interface logic circuit 32d through the data input terminals 32b.

A control circuit (controller) 33 is provided in the storage unit 30 to control the transfer of the chip identification code CHIP-ID and control data through the address signal lines A0, A1 and A2 and data lines D3, D4 and D5. Thus, the chip identification code CHIP-ID and control data stored in the fuse macro 31 are once written to the memory macro 32 and then transferred serially to the registers 21, 22, 23 and 24 on the semiconductor chip 11.

An operation of the above storage unit 30 performed at power-on (initialization) will be described more specifically. In this embodiment, a change in setting information of the circuit 13 is taken as an example; however, the same is true of another example.

The identification information stored in the fuse cell section 31a corresponding to F00, F01, F02 in the address area 31A of the fuse macro 31 is read out through the latch circuit 31d under the control of the control circuit 33. The read information is output onto the address signal lines A0, A1 and A2 through the parallel-out terminal 31e. Thus, the identification information is input as an address signal to the decoder circuits 32a in the memory macro 32 through the data input terminals 32b. On the other hand, the chip identification code CHIP-ID stored in the fuse cell section 31a corresponding to F03, F04, F05 in the data area 31B is read out through the latch circuit 31d under the control of the control circuit 33. The read information is output onto the data lines D3, D4 and D5 through the parallel-out terminal 31e. Thus, the chip identification code CHIP-ID is input to the interface logic circuit 32d in the memory macro 32 through the data input terminals 32b. Since the identification information of the chip identification code CHIP-ID is "1", the word line WL1 is selected by the decoder circuit 32a. Thus, the chip identification code CHIP-ID is written to the memory cells 32c corresponding to M31, M41 and M51 through the data lines DL3, DL4 and DL5.

Similarly, the identification information stored in the fuse cell section 31a corresponding to F10, F11, F12 in the address area 31A of the fuse macro 31 is input as an address signal to the decoder circuits 32a in the memory macro 32 under the control of the control circuit 33. On the other hand, the setting information of the circuit 13 stored in the fuse cell section 31a corresponding to F13, F14, F15 in the data area 31B is input to the interface logic circuit 32d in the memory macro 32 under the control of the control circuit 33. Since the identification information of the circuit 13 is "2", the word line WL2 is selected. Thus, the setting information of the circuit 13 is written to the memory cells 32c corresponding to M32, M42 and M52 through the data lines DL3, DL4 and DL5.

Similarly, the identification information stored in the fuse cell section 31a corresponding to F20, F21, F22 in the address area 31A of the fuse macro 31 is input as an address signal to the decoder circuits 32a in the memory macro 32 under the control of the control circuit 33. On the other hand, the setting information of the circuit 14 stored in the fuse cell section 31a corresponding to F23, F24, F25 in the data area 31B is input to the interface logic circuit 32d of the memory macro 32 under the control of the control circuit 33. Since the identification information of the circuit 14 is "3", the word line WL3 is selected. Thus, the setting information of the circuit 14 is written to the memory cells 32c corresponding to M33, M43 and M53 through the data lines DL3, DL4 and DL5.

Similarly, the identification information stored in the fuse cell section 31a corresponding to F30, F31, F32 in the address area 31A of the fuse macro 31 is input to the decoder circuits 32a of the memory macro 32 as an address signal under the control of the control circuit 33. On the other hand, the replacement information of the memory circuit 12 stored in the fuse cell section 31a corresponding to F33, F34, F35 in the data area 31B is input to the interface logic circuit 32d of the memory macro 32 under the control of the control circuit 33. Since the identification information of the memory circuit 12 is "4", the word line WL4 is selected. Thus, the replacement information of the memory circuit 12 is written to the memory cells 32c corresponding to M34, M44 and M54 through the data lines DL3, DL4 and DL5.

The chip identification code CHIP-ID, the setting information of the circuit 13, the setting information of the circuit 14, and the replacement information of the memory circuit 12, which are stored in the memory macro 32, are transferred in sequence from the data output terminal 32e to the registers 21 to 24 on the semiconductor chip 11 through the interface logic circuit 32d under the control of the control circuit 33. Using the identification information as an address signal, the decoder circuits 32a are driven in sequence through the address signal lines A0, A1 and A2, with the result that the chip identification code CHIP-ID, the setting information of the circuit 13, the setting information of the circuit 14 and the replacement information of the memory circuit 12 are sent to the registers 21, 22, 23 and 24, respectively.

Consequently, the internal settings of the circuits 12, 13 and 14 are performed in accordance with the chip identification code CHIP-ID and various items of control data stored in the registers 21 to 24.

The following is a description of an operation of rewriting the setting information of the circuit 13, which is written to the fuse cell section 31a corresponding to F13, F14, F15 in the data area 31B as the result of a test, in accordance with the result of another test.

Assume that "111" has already been written to the fuse cell section 31a corresponding to F13, F14, F15 in the data area 31B as the setting information of the circuit 13. When this setting information is rewritten by "001", the identification information "2" of the circuit 13, which is to be rewritten, is written to the fuse cell section 31a corresponding to F40, F41, F42 in the address area 31A of the unused fuse macro 31, as shown in FIG. 6. Further, the setting information "001" of the circuit 13, which is to be rewritten, is written to the fuse cell section 31a corresponding to F43, F44, F45 in the data area 31B of the fuse macro 31.

The identification information written to the fuse cell section 31a corresponding to F40, F41, F42 in the address area 31A of the fuse macro 31 is read out through the latch circuit 31d under the control of the control circuit 33 and output onto the address signal lines A0, A1 and A2 through the parallel-out terminal 31e. Thus, the identification information is input as an address signal to the decoder circuits 32a of the memory macro 32 through the data input terminals 32b.

On the other hand, the setting information "001" written to the fuse cell section 31a corresponding to F43, F44, F45 in the data area 31B is read out through the latch circuit 31d under the control of the control circuit 33 and then output onto the data lines D3, D4 and D5 through the parallel-out terminals 31e. Then, it is input to the interface logic circuit 32d of the memory macro 32 through the data input terminals 32b.

Since the identification information of the circuit 13, which is to be rewritten, is "2", the word line WL2 is selected. Therefore, the setting information "001" of the circuit 13, which is to be rewritten, is written to the memory cell 32c corresponding to M32, M42 and M52, to which the setting information "111" has already been written, through the data lines DL3, DL4 and DL5. In other words, during the data transfer, the setting information "111" stored in the fuse cell section 31a corresponding to F13, F14, F15 in the data area 31B of the fuse macro 31 is written to the memory cell 32c corresponding to M32, M42 and M52 in the memory macro 32 that stores the setting information of the circuit 13. However, the setting information "111" is updated (overwritten) by the subsequent different setting information "001" stored in the fuse cell section 31a corresponding to F43, F44, F45 in the data area 31B. Thus, the updated setting information "001" of the circuit 13 is stored in the register 22 on the semiconductor chip 11.

Consequently, the nonvolatile chip identification code CHIP-ID or control data stored in the OTP memory 31 can be rewritten in a pseudo-manner by updating the chip identification code CHIP-ID and control data written to the SRAM 32 in an address corresponding to the identification information. The chip identification code CHIP-ID or other control data is rewritten in the same manner though its detailed descriptions are omitted here.

As described above, the data that is programmed in the physical address corresponding to the identification information of the fuse macro is moved to the rewritable memory macro and then transferred to each of the registers. The data can thus be updated by newly programmed difference data having the same address on the memory macro. Consequently, the programmed data can be rewritten in a pseudo-manner by varying the electrical characteristics irreversibly; therefore, a user can easily cope with the demand for rewriting the programmed control data.

According to the present embodiment, not only a chip identification code CHIP-ID or control data can be rewritten, but also a defective cell can be replaced with a defect-free one in a fuse macro. When there is a defective fuse cell (defective cell) in a fuse macro, it is originally a critical defect. If, however, identification information and control data of a circuit corresponding to the defective fuse cell is stored using a redundant fuse cell, the defective fuse cell can be replaced in the fuse macro.

In the foregoing embodiment, a chip identification code CHIP-ID or control data is written in sequence from the word line WL1 in consideration of the order of transfer of the chip identification code CHIP-ID or control data to the registers 21, 22, 23 and 24 in the memory macro 32. The present invention is not limited to this. For example, a chip identification code CHIP-ID or control data can be written in sequence from the word line WL8 or at random in accordance with the setting of identification information.

Second Embodiment

Figure 7:
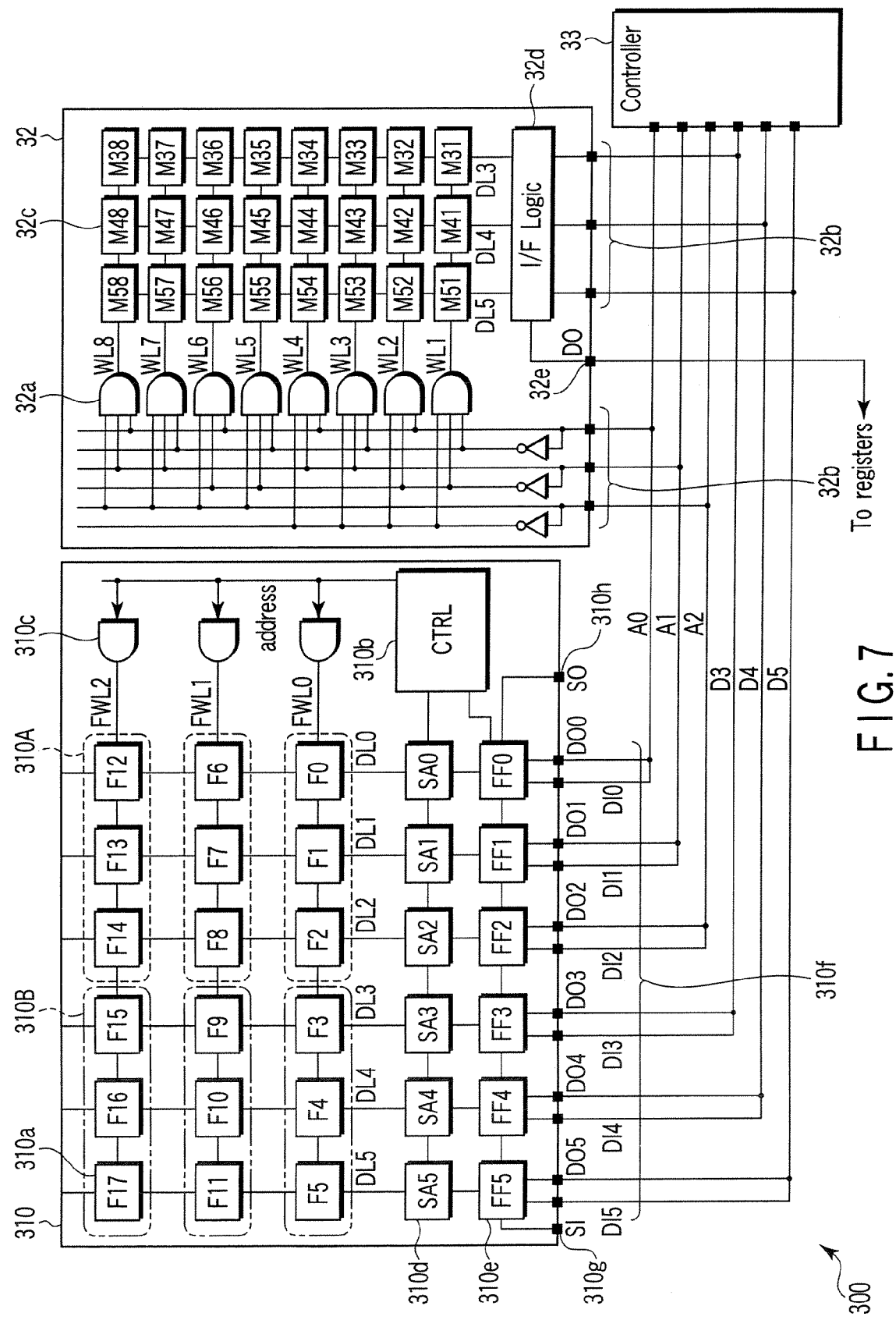
FIG. 7 is a block diagram showing an example of a storage unit in a system LSI according to a second embodiment of the present invention.

FIG. 7 shows another configuration example of a storage unit for use in a system LSI (semiconductor integrated circuit device) according to a second embodiment of the present invention. Here, description will be given to a case in which fuse cell sections configured by fuse cells, selective transistors and the like are arranged in a matrix form, and sense circuits, registers and the like are shared by a plurality of fuse cells, which makes it possible to make the device have a smaller area. Note that the same functional components as those in the first embodiment are denoted by the same reference numerals, and detailed descriptions here will be omitted.

In the second embodiment, a storage unit 300 includes, as shown in FIG. 7, a fuse macro 310, a memory macro 32, and a control circuit 33. The fuse macro 310 is an OTP memory into which a chip identification code CHIP-ID and control data can be written only once. For example, as irreversible memory elements (fuse cells) F, high-voltage breaking type e-fuse elements having two terminals are used.

More specifically, for example, a plurality of (eighteen in this example) fuse cell sections (F0 to F17) 310a represented as "Fn" are arranged in a matrix (array) form of 3 bits×6 bits in the fuse macro 310. In practice, a cell block (e-fuse block) which will be described later is configured by many more fuse cell sections 310a. Also provided in the fuse macro 310 are a control circuit (CTRL) 310b, decoder circuits 310c, data sensing/programming circuits (SA0 to SA5) 310d, data buffer/registers (FF0 to FF5) 310e, and a voltage control block (not shown).

The control circuit 310b is designed to, for example, load various control signals and the like (not shown) from a controller 33 side to prepare address data to be supplied to the decoder circuits 310c, prepare a control signal for controlling the data buffer/registers 310e, or generate an internal potential to be used for controlling the data sensing/programming circuits 310d.

The decoder circuits 310c respectively decode address data from the control circuit 310b, and selectively drive one of fuse word lines FWL (FWL0 to FWL2 in this example). In the present embodiment, for example, six fuse cell sections 310a of F to F5 are connected to the fuse word line FWL0. Six fuse cell sections 310a of F6 to F11 are connected to the fuse word line FWL1. And six fuse cell sections 310a of F12 to F17 are connected to the fuse word line FWL2. These fuse cell sections 310a are divided into six groups, and fuse cell sections 310a on each array are connected to one another via data lines DL (DL0 to DL5 in this example). In other words, among the fuse cell sections 310a represented as F to F17, for example, the fuse cell sections 310a (F, F6, F12) are connected to the data line DL0. For example, the fuse cell sections 310a (F1, F7, F13) are connected to the data line DL1, the fuse cell sections 310a (F2, F8, F14) are connected to the data line DL2, the fuse cell sections 310*a* (F3, F9, F15) are connected to the data line DL3, the fuse cell sections 310*a* (F4, F10, F16) are connected to the data line DL4, and the fuse cell sections 310*a* (F5, F11, F17) are connected to the data line DL5.

The data sensing/programming circuits 310*d* respectively read and write data from and into the fuse cell sections 310*a* in accordance with control signals from the control circuit 310*b*. The data sensing/programming circuits 310*d* respectively drive the data lines DL0 to DL5, and have, for example, sense amplifiers that sense data read from the fuse cell sections 310*a*. The data sensing/programming circuit 310*d* also has a circuit (not shown) for discharging the sense amplifiers and programming data.

The data buffer/registers 310*e* are respectively connected to the data sensing/programming circuits 310*d* to control hold/transfer of fuse data in accordance with a control signal from the control circuit 310*b*. DI0 to DI5/DO0 to DO5 serving as parallel input/output terminals 310*f* are respectively connected to the data buffer/registers 310*e*, and fuse data of 6 bits can be simultaneously output. A serial input terminal (SI) 310*g* serving as an external input terminal is connected to the data buffer/register 310*e* at one end, and a serial output terminal (SO) 310*h* serving as an external output terminal is connected to the data buffer/register 310*e* at the other end, respectively.

Among the parallel input/output terminals 310*f*, the parallel input/output terminals (DI0, DO0) are connected to a data input terminal 32*b* of the memory macro 32 and the control circuit 33 via the address signal line A0. The parallel input/output terminals (DI1, DO1) are connected to the data input terminal 32*b* of the memory macro 32 and the control circuit 33 via the address signal line A1. The parallel input/output terminals (DI2, DO2) are connected to the data input terminal 32*b* of the memory macro 32 and the control circuit 33 via the address signal line A2. The parallel input/output terminals (DI3, DO3) are connected to the data input terminal 32*b* of the memory macro 32 and the control circuit 33 via the data line D3. The parallel input/output terminals (DI4, DO4) are connected to the data input terminal 32*b* of the memory macro 32 and the control circuit 33 via the data line D4. The parallel input/output terminals (DI5, DO5) are connected to the data input terminal 32*b* of the memory macro 32 and the control circuit 33 via the data line D5.

In the configuration of FIG. 7, the fuse cell sections 310*a* in the fuse macro 310 are assigned to the two areas 310A and 310B. For example, the fuse cell sections 310*a* of the area (address area) 310A store identification information (storage addresses) for identifying areas for the circuits 12, 13, and 14 requiring for control data, and chip ID. Of the fuse cell sections 310*a* represented as "Fn", for example, the respective cell sections 310*a* of F to F2, F6 to F8, and F12 to F14 are included in the area 310A. In contrast, the fuse cell sections 310*a* of the area (data area) 310B store control data for optimizing the respective circuits 12, 13, and 14, or the like in practice. Of the fuse cell sections 310*a* represented as "Fn", for example, the respective cell sections 310*a* of F3 to F5, F9 to F11, and F15 to F17 are included in the area 310B.

More specifically, as shown in FIG. 5, when the chip identification code CHIP-ID is stored in the register 21, identification information "1" is written to the fuse cell sections 310*a* of F0, F1 and F2 corresponding to the address area 310A. The chip identification code CHIP-ID is also written to the fuse cell sections 310*a* of F3, F4 and F5 corresponding to the data area 310B. Similarly, when setting information of the circuit 13 is stored in the register 22, identification information "2" is written to the fuse cell sections 310*a* of F6, F7 and F8 corresponding to the address area 310A. The setting information is also written to the fuse cell sections 310*a* of F9, F10 and F11 corresponding to the data area 310B. Similarly, setting information of the circuit 14 is stored in the register 23, identification information "3" is written to the fuse cell sections 310*a* of F12, F13 and F14 corresponding to the address area 310A. The setting information is also written to the fuse cell sections 310*a* of F15, F16 and F17 corresponding to the data area 310B.

In particular, in FIG. 7, only eighteen fuse cell sections 310*a* are shown for convenience. However, when replacement information of the memory circuit (SRAM) 12 is stored in the register 24, for example, identification information "4" is written to predetermined fuse cell sections 310*a* corresponding to the address area 310A, which are connected to a fuse word line FWL3 (not shown). The replacement information is also written to predetermined fuse cell sections 310*a* corresponding to the data area 310B, which are connected to the same fuse word line FWL3.

Next, the operations of the fuse macro 310 described above will be simply described. For example, when fuse data stored in the fuse cell sections 310*a* of F0 to F5 are read out, the fuse word line FWL0 is first selected by the decoder circuit 310*c* in accordance with address data from the control circuit 310*b*. Then, the fuse data stored in the fuse cell sections 310*a* of F0 to F5 are read out respectively via the data lines DL0 to DL5. The data read onto the data lines DL0 to DL5 are amplified and held by the data sensing/programming circuit 310*d*. Identification information out of the amplified data are held by the FF0 to FF2 serving as the data buffer/registers 310*e*, and then output from the DO0 to DO2 serving as the parallel output terminals 310*f* to the address signal lines A0 to A2. On the other hand, chip identification codes CHIP-ID out of the amplified data are held by the FF3 to FF5 serving as the data buffer/registers 310*e*, and then output from the DO3 to DO5 serving as the parallel output terminals 310*f* to the data lines D3 to D5.

In contrast, for example, when fuse data are written to the fuse cell sections 310*a* of F to F5, the fuse word line FWL0 is first selected by the decoder circuit 310*c* in accordance with address data from the control circuit 310*b*. The identification information from the control circuit 33 and the chip identification codes CHIP-ID corresponding to the identification information are loaded into the data buffer/registers 310*e* via the DI0 to DI5 serving as the parallel input terminals 310*f*, or are loaded into the data buffer/registers 310*e* via the serial input terminal (SI) 310*g*. The identification information loaded in the FF0 to FF2 serving as the data buffer/registers 310*e* are written to the fuse cell sections 310*a* of F0 to F2 via the data lines DL0 to DL2 by the SA0 to SA2 serving as the data sensing/programming circuits 310*d*. On the other hand, the chip identification codes CHIP-ID loaded into the FF3 to FF5 serving as the data buffer/registers 310*e* are written to the fuse cell sections 310*a* of F3 to F5 via the data lines DL3 to DL5 by the SA3 to SA5 serving as the data sensing/programming circuits 310*d*.

In this way, writing and reading of the chip identification codes CHIP-ID stored into the register 21 described above and the identification information thereof, into and from the fuse cell sections 310*a*, are carried out.

Although the detailed descriptions will be omitted, reading of the fuse data stored in the fuse cell sections 310*a* of F6 to F11, and reading of the fuse data stored in the fuse cell sections 310*a* of F12 to F17 are also performed similarly. In addition, writing of the fuse data into the fuse cell sections 310a of F6 to F11, and writing of the fuse data into the fuse cell sections 310a of F12 to F17 are performed similarly.

Note that, because the configuration of the memory macro 32 and the operations at the time of power-on (initialization) or the like are the same as those in the above-described first embodiment, descriptions thereof here will be omitted.

As described above, according to the configuration of the second embodiment, the SA0 to SA5 serving as the data sensing/programming circuits 310d and the FF0 to FF5 serving as the data buffer/registers 310e are shared on every cell array of the fuse cell sections 310a, and consequently, the cell block can be configured by only the fuse cell sections 310a, which makes it possible to greatly reduce a size of the fuse macro 310. Therefore, it is possible to achieve the storage unit 300 with a small area.

Because the fuse cell sections 310a can be controlled in units of rows by the decoder circuit 310c, it is also possible to easily execute input/output of data in parallel.

Here, the configuration of the fuse macro 310 according to the second embodiment of the invention will be further described.

Figure 8:
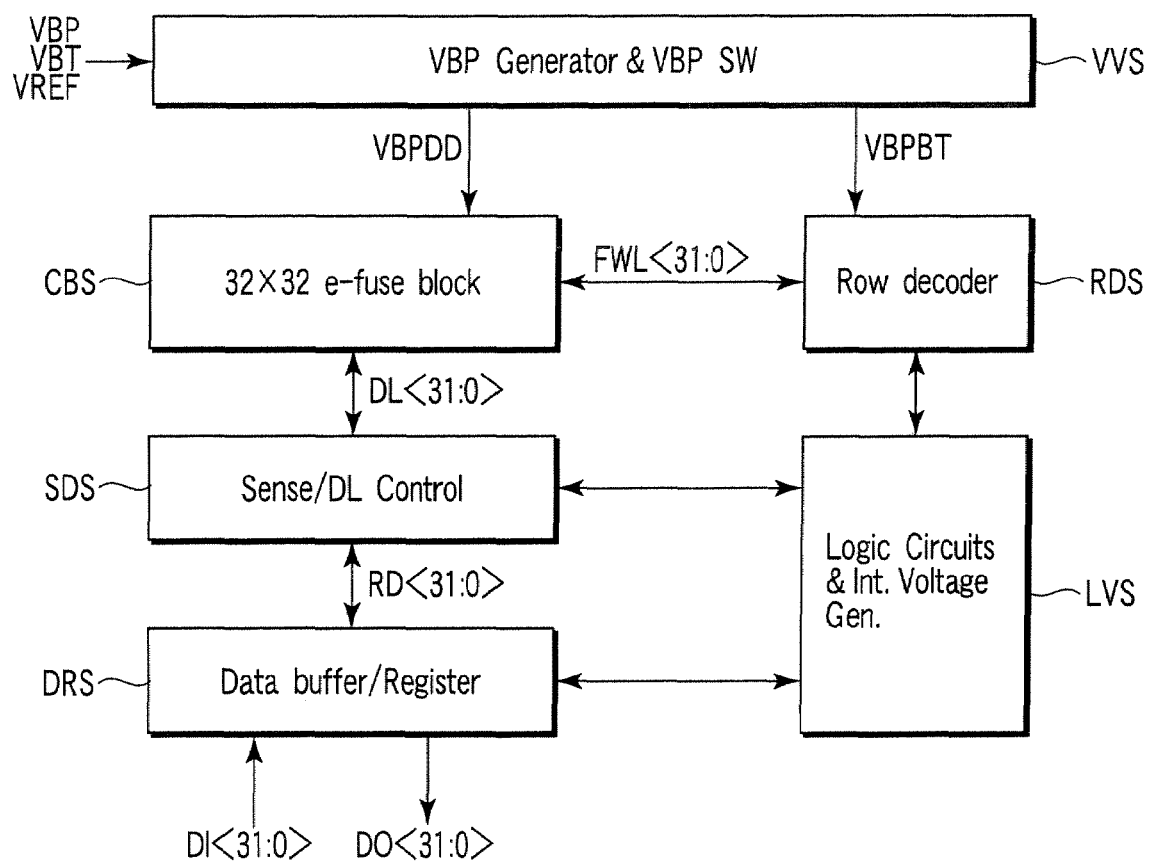
FIG. 8 is a block diagram showing a configuration of a fuse macro of the storage unit shown in FIG. 7.

FIG. 8 is a block diagram showing the configuration of the fuse macro 310. Note that a case in which the configuration of the cell block is made to be 1024 bits (32 bits×32 bits) will be described.

As shown in FIG. 8, the fuse macro 310 is configured to have a cell block (32×32 e-fuse block) CBS, a row decoder section RDS serving as a row selection control circuit, a sense/DL control section SDS, a data buffer/register section DRS, an internal potential generation circuit and logic circuit section (Logic Circuits & Int. Voltage Gen.) LVS, and a high voltage generation circuit and a voltage control block (VBP Generator & VBP SW) VVS for controlling a voltage to be applied to each part of the fuse macro 310.

Figure 9:
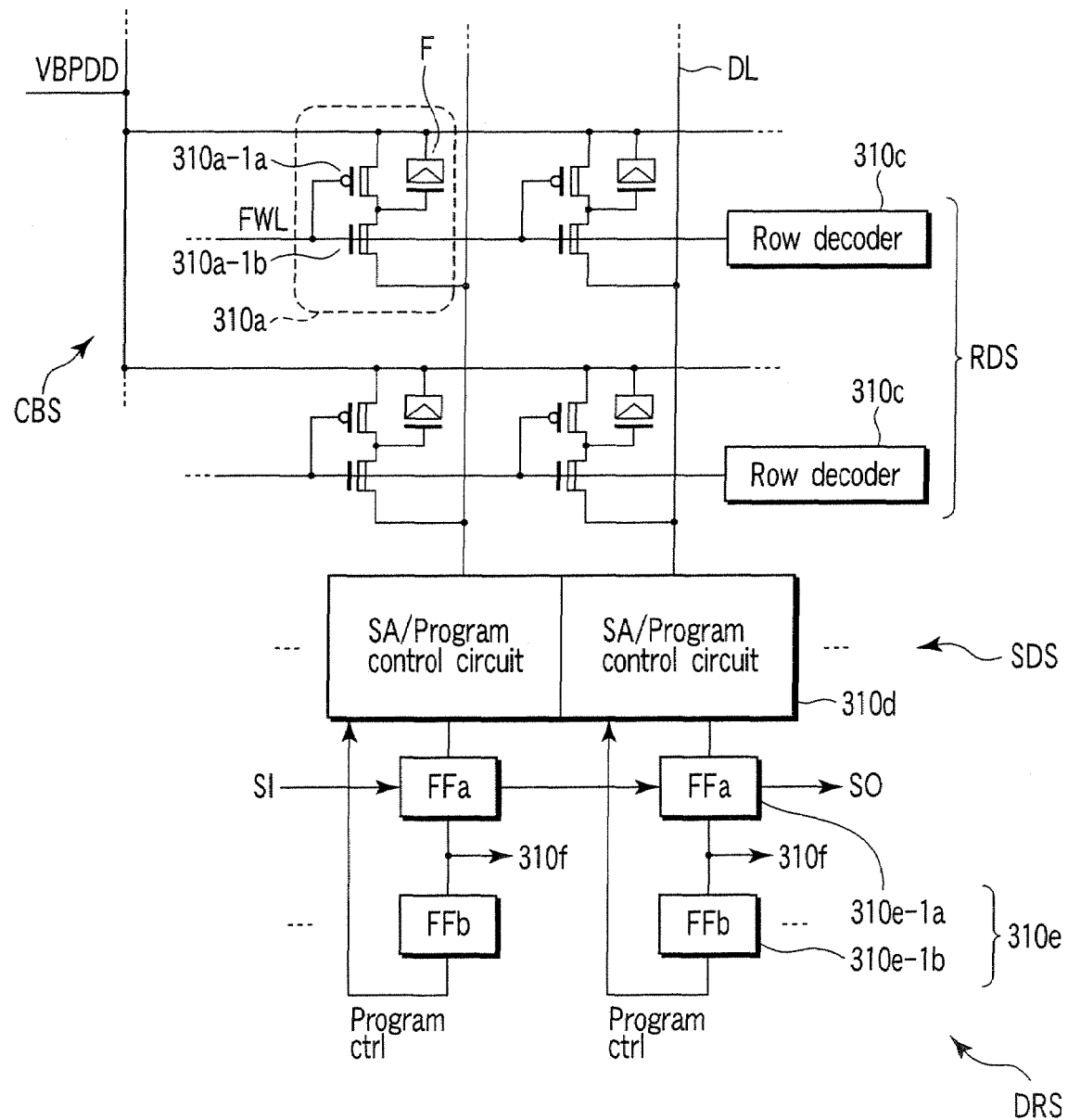
FIG. 9 is a block diagram showing a main portion of the fuse macro shown in FIG. 8.

In FIG. 8, with respect to the cell block CBS, 1024 fuse cell sections (F0 to F1023) 310a are arranged in a matrix (array) form of 32 bits×32 bits, as shown in, for example, FIG. 9 (In FIG. 9, four (2 bits×2 bits) cell sections 310a are shown for convenience). Each fuse cell section 310a includes an e-fuse element F having two terminals, a p-type MOS transistor (protective transistor) 310a-1a for relaxing an electric field at time of non-programming to the e-fuse element F, the p-type MOS transistor serving as the control element, and the n-type MOS transistor 310a-1b serving as a selective transistor (selective switch) for controlling connection of the e-fuse elements F and the protective transistors 310a-1a with the data lines DL.

In each fuse cell 310a of the present embodiment, a potential VBPDD from the VBP Generator & VBP SW VVS is applied to the substrate side of the e-fuse element F (the substrate and the source/drain) and one of the source/drain terminals of the protective transistor 310a-1a. The other terminal of the e-fuse element F (gate electrode) is connected to a connection point between the other of the source/drain terminals of the protective transistor 310a-1a and one of the source/drain terminals of the n-type MOS transistor 310a-1b. The respective gate terminals of the protective transistor 310a-1a and the n-type MOS transistor 310a-1b are connected to any one of 32 fuse word lines (row selection lines) FWL (FWL <31:0>). The other side of the source/drain terminals of the n-type MOS transistor 310a-1b is connected to any one of the 32 data lines DL (DL <31:0>).

More specifically, of the fuse cell sections 310a of 1024 bits arranged in a matrix form, the fuse cell sections 310a of 32 bits arranged in the row direction are respectively connected to a common fuse word line FWL. The fuse word lines FWL to which the fuse cell sections 310a of 32 bits in the row direction are commonly connected are driven by the respective decoder circuits 310c configuring the row decoder section RDS. Accordingly, by driving any one of the fuse word lines FWL by a certain decoder circuit 310c, the fuse cell sections 310a of 32 bits connected to the same fuse word line FWL are simultaneously selected.

Similarly, the fuse cell sections 310a of 32 bits arranged in the column direction are respectively connected to a common data line DL. The respective data lines DL to which the fuse cell sections 310a of 32 bits in the column direction are commonly connected are driven by the SA0 to SA31 serving as the respective data sensing/programming circuit 310d configuring the sense/DL control circuit section SDS.

The row decoder section RDS is configured by 32 decoder circuits 310c. For example, as shown in FIG. 8, a potential VBPBT is supplied to the row decoder section RDS by the VBP Generator & VBP SW VVS.

The sense/DL control circuit section SDS includes, for example, as shown in FIG. 9, 32 data sensing/programming circuits 310d provided on each data line DL. As described above, each data sensing/programming circuit 310d is configured to have a sense amplifier (S/A) which senses data (for example, a current value) read on the data line DL from the fuse cell section 310a through comparison with a reference value or the like.

The logic circuits & int. voltage gen. LVS includes the above-described control circuit 310b. For example, as shown in FIG. 8, the logic circuits & int. voltage gen. LVS is designed to load various control signals from a controller (not shown) side to thereby prepare new control signals or generate an internal voltage for use in control of the sense amplifier or the like.

The VBP Generator & VBP SW VVS is, for example, as shown in FIG. 8, configured by power supply circuits which prepare and supply a potential VBPDD and a potential VBPBT. The VBP Generator & VBP SW VVS makes a control such that, for example, potentials VBPDD in operation of a program, at the time of reading data, and on standby become a potential VBP (a high voltage over the maximum rating of the e-fuse element F), a power supply voltage VDD, and 0 V, respectively. Further, potentials VBPBT in operation of a program, at the time of reading data, and on standby are controlled to be respectively a potential VBP (a high voltage over the maximum rating of the e-fuse element F), a potential VBT (midpoint potential of a fuse word line FWL at the time of reading), and 0 V.

The data buffer/register section DRS is for managing data (DI <31:0>, DO <31:0>) to be exchanged with the exterior, and has FF0 to FF31 serving as the 21 data buffer/registers 310e. The data buffer/register 310e includes, for example, as shown in FIG. 9, a data control circuit (FFa) 310e-1a and a data holding circuit (FFb) 310e-1b which are provided every data line DL. Note that, as a write control circuit, the data control circuit 310e-1b is configured to supply the program control signal to the data sensing/programming circuit 310d.

As described above, in the fuse macro 310 using e-fuse elements F as memory elements, a plurality of e-fuse elements F are arranged in a matrix form in units of cells, and a circuit block (the sense/DL control section SDS) which controls a sense amplifier and a data line DL, and the like are shared every data line DL. Consequently, it is possible to achieve the storage unit 300 with an extremely small area as compared with that of the first embodiment.

Note that, in the case of the present embodiment, the fuse cells F are not limited to e-fuse elements for breaking a gate-oxide film electrically. For example, memory elements for storing fuse data by causing current to flow through a wiring layer to electrically insulate the wiring layer, or memory elements for storing fuse data by irradiating a wiring layer with a laser beam to break physically the wiring layer can be also used.

Needless to say, the number of fuse cells can be increased or decreased when necessary, as can be the number of memory cells in any of the above-described embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
a storage unit arranged on a semiconductor chip to store a plurality of data; and
a plurality of registers provided on the semiconductor chip, the registers storing the data transferred from the storage unit, respectively, wherein
the storage unit has a nonvolatile memory element section and a volatile memory element section, the nonvolatile memory element section including an address area which stores identification information of the registers as addresses and a data area which stores the data to correspond to the addresses by varying electrical characteristics irreversibly, the volatile memory element section temporarily storing the data read from the nonvolatile memory element section.
the volatile memory element section includes a plurality of memory cells and a decoder circuit which selects one of memory cells based on the address, the volatile memory element section storing the data corresponding to the address into the memory cell selected based on the address, and
the volatile memory element section rewrites the data, which are read from a data area, and already stored in the memory cells selected on the basis of the addresses, as different data having a same address which are read from a different data area.

2. The semiconductor integrated circuit device according to claim 1, further comprising a plurality of circuit components provided on the semiconductor chip to correspond to the registers, wherein
the data are chip identification codes of the semiconductor chip or control data for the circuit components.

3. The semiconductor integrated circuit device according to claim 2, wherein the control data include information to be set after a test.

4. A semiconductor integrated circuit device comprising:
a plurality of circuit components arranged on a semiconductor chip;
a storage unit which is arranged on the semiconductor chip to store control data to control the circuit components and which is programmed with the control data by varying electrical characteristics irreversibly, the storage unit including a nonvolatile memory element section and a volatile memory element section, the nonvolatile memory element section having an address area which stores identification information of the circuit components as an address and a data area which stores the control data to correspond to the address, the volatile memory element section temporarily storing control data read from the nonvolatile memory element section; and
a plurality of registers provided on the semiconductor chip to correspond to the circuit components, respectively, the registers storing control data transferred from the storage unit, wherein
the volatile memory element section stores the control data read from a data area of the nonvolatile memory element section in an address corresponding to identification information of a circuit component corresponding to the control data, and rewrites the control data, which is stored in the volatile memory element section, as control data of the same address which is read out of another data area of the nonvolatile memory element section.

5. The semiconductor integrated circuit device according to claim 4, wherein the volatile memory element section has a plurality of memory cells and a decoder circuit which selects one of the memory cells based on the address, the volatile memory element section storing the control data corresponding to the address into the memory cell selected based on the address.

6. The semiconductor integrated circuit device according to claim 5, wherein the volatile memory element section is a static random access memory.

7. The semiconductor integrated circuit device according to claim 4, wherein the control data includes setting information which sets a circuit constant of the circuit components, and the setting information is stored in an address corresponding to the identification information of the circuit components.

8. The semiconductor integrated circuit device according to claim 4, wherein the control data includes replacement information of a memory circuit, and the replacement information is stored in an address corresponding to the identification information of the memory circuit.

9. The semiconductor integrated circuit device according to claim 4, wherein the nonvolatile memory element section includes a plurality of memory elements which includes memory cell (fuse), sense amplifier, and data registers, and the memory elements are connected serially.

10. The semiconductor integrated circuit device according to claim 9, wherein the memory elements store data by electrically breaking a gate insulation film of a metal oxide semiconductor device by applying a high voltage to the gate insulation film.

11. The semiconductor integrated circuit device according to claim 9, wherein the memory elements store data by electrically insulating a wiring layer by causing current to flow through the wiring layer.

12. The semiconductor integrated circuit device according to claim 9, wherein the memory elements store data by electrically insulating a wiring layer by irradiating the wiring layer with a laser beam.

13. The semiconductor integrated circuit device according to claim 4, wherein the nonvolatile memory element section includes a row decoders, sense amplifiers and control circuitry and a plurality of memory elements, and the memory elements are arranged in matrix.

14. The semiconductor integrated circuit device according to claim 13, wherein the memory elements store data by electrically breaking a gate insulation film of a metal oxide semiconductor device by applying a high voltage to the gate insulation film.

15. The semiconductor integrated circuit device according to claim 13, wherein the memory elements store data by electrically insulating a wiring layer by causing current to flow through the wiring layer.

16. The semiconductor integrated circuit device according to claim 13, wherein the memory elements store data by electrically insulating a wiring layer by irradiating the wiring layer with a laser beam.

17. The semiconductor integrated circuit device according to claim 4, wherein the registers are connected to each other through a serial chain, and receive the control data from the storage unit when the registers are initialized.

* * * * *